United States Patent [19]

Kusuda et al.

[11] Patent Number: 5,073,477

[45] Date of Patent: Dec. 17, 1991

[54] PHOTOSENSITIVE RESIN COMPOSITION

[75] Inventors: Hidefumi Kusuda, Takatsuki; Katsuji Konishi, Ibaraki; Koichi Ueda, Neyagawa, all of Japan

[73] Assignee: Nippon Paint Co., Ltd., Osaka, Japan

[21] Appl. No.: 621,435

[22] Filed: Dec. 4, 1990

[30] Foreign Application Priority Data

May 28, 1988 [JP] Japan ................ 63-131192

[51] Int. Cl.$^5$ .................. G03F 7/031; G03F 7/033
[52] U.S. Cl. .................. 430/287; 430/286; 430/283; 430/907; 430/910; 522/110; 522/14; 522/26; 522/28; 522/43; 522/48; 522/33
[58] Field of Search ........... 430/287, 286, 283, 910, 430/907; 522/110, 43, 48, 33, 28, 26, 14

[56] References Cited

U.S. PATENT DOCUMENTS

| | | | |
|---|---|---|---|
| 4,045,231 | 8/1977 | Toda et al. | 430/286 |
| 4,499,176 | 2/1985 | Curtis et al. | 430/283 X |
| 4,772,538 | 9/1988 | Walls et al. | 430/286 X |
| 4,996,134 | 2/1991 | Enyo et al. | 430/287 X |

FOREIGN PATENT DOCUMENTS 88-02135 3/1988 PCT Int'l Appl. ................ 430/286

Primary Examiner—Cynthia Hamilton
Attorney, Agent, or Firm—Wenderoth, Lind & Ponack

[57] ABSTRACT

Disclosed is a photosensitive resin composition for flexographic printing which has high water developability and good mechanical strength. The resin composition comprises (A) a partially crosslinked copolymer prepared by a radical emulsion polymerization of a specific monomer mixture (B) a linear polymer having a molecular weight of at least 5,000, which has at least 30 mol % of a conjugated diene unit, (C) a basic nitrogen atom-containing compound, (D) a photopolymerizable ethylenically unsaturated monomer, and (E) a photopolymerization inhibitor. The present invention also provides a resin plate for flexographic printing obtained from the above mentioned resin composition and a process for preparing it. The present invention further provides a printing plate obtained from the resin plate and a process for preparing it.

10 Claims, No Drawings

PHOTOSENSITIVE RESIN COMPOSITION

FIELD OF THE INVENTION

The present invention relates to a photosensitive resin composition for flexographic printing.

DEFINITION OF THE TERMINOLOGY

By "photosensitive resin plate" is meant a resin plate before exposure and development, which basically comprises a substrate and a photosensitive resin layer formed on the substrate.

By "printing plate" is meant a plate having a relief image, which is prepared by exposing the photosensitive resin plate to light and developing.

BACKGROUND OF THE INVENTION

In view of handling, health and safety of workers, air pollution and the like, it is desired that the photosensitive resin plate which is employed for flexographic printing can be developed with water rather than organic solvent. It is also required that the printing plate having a relief image after exposure and development has a chemical resistance against aqueous ink or alcohol-based ink which is usually used in flexographic printing. It is further desired that the physical and printing properties of the printing plate are stable and do not change between before and after printing.

Japanese Kokoku Publication 35481/1978 discloses a liquid type photosensitive resin composition for flexographic printing, which mainly contains a liquid unsaturated polyester. However, it is difficult that a resin composition layer on a substrate is formed with accurate thickness, because the composition is liquid. Also, for developing this composition, a specific air knife should be required.

A solid type photosensitive resin composition for flexographic printing is proposed in U.S. Pat. No. 4,369,246, but this is developed with organic solvent which arises the problems caused by the organic solvent, as mentioned above.

Water developable photosensitive resin compositions for flexographic printing are also proposed in U.S. Pat. Nos. 2,893,868, 4,275,142 and Japanese Kokai (unexamined) Publication 22339/1986. However, the compositions of the both U.S. patents do not have sufficient water developability for industrial scale printing and the resin plates obtained therefrom have poor water resistance. The printing plate obtained by the Japanese specification also has poor mechanical strength.

In order to improve water developability, U.S. Pat. No. 4,177,074 and Japanese Kokoku (examined) Publication 45416/1985 propose a combination of a high molecular weight conjugated diolefinic hydrocarbon and a low molecular weight conjugated diolefinic hydrocarbon, but mechanical strength is not improved.

SUMMARY OF THE INVENTION

The present invention provide a photosensitive resin composition for flexographic printing which has high water developability and good mechanical strength. The resin composition of the present invention comprises:
(A) a partially crosslinked copolymer prepared by a radical emulsion polymerization of a monomer mixture which comprises;
  (i) 40 to 95 mol % of an aliphatic conjugated diene monomer,
  (ii) 1 to 30 mol % of an alpha, betaethylenically unsaturated carboxylic acid, and
  (iii) 0.1 to 10 mol % of a compound having at least two addition polymerizable groups,
(B) a linear polymer having a molecular weight of at least 5,000, which has at least 30 mol % of a conjugated diene unit,
(C) a basic nitrogen atom-containing compound,
(D) a photopolymerizable ethylenically unsaturated monomer, and
(E) a photopolymerization initiator.

The present invention also provides a resin plate for flexographic printing obtained from the above mentioned resin composition and a process for preparing it.

The present invention further provides a printing plate obtained from the resin plate and a process for preparing it.

DETAILED DESCRIPTION OF THE INVENTION

The partially crosslinked copolymer (A) is generally prepared from the monomer mixture of (i) an aliphatic conjugated diene monomer, (ii) an alpha, betaethylenically unsaturated carboxylic acid and (iii) a compound having at least two addition polymerizable groups. The monomer mixture may further contain (iv) a copolymerizable monomer other than the monomers (i), (ii) and (iii). The diene monomer (i) is present in the obtained copolymer (A) in an amount of 40 to 95 mol %, preferably 40 to 85 mol %. The monomer (ii) is present in an amount of 1 to 30 mol %, preferably 2.5 to 10 mol % and the monomer (iii) is present in an amount of 0.1 to 10 mol %, preferably 0.5 to 3.0 mol %. The monomer (iv) may be present in an amount of 55 mol % or less. If the monomer (i) is less than 40 mol %, the obtained printing plate has poor resilience. If the monomer (i) is more than 95 mol %, the photosensitive resin plate has poor water developability. If the monomer (ii) is less than 1 mol %, the resin plate has poor water developability. If the monomer (ii) is more than 30 mol %, the printing plate has poor water resistance. If the monomer (iii) is less than 0.1 mol %, the resin composition has poor molding ability. If the monomer (iii) is more than 10 mol %, the obtained printing plate has poor resilience. It is believed that the monomer (iii) contributes crosslinking reactions, thus imparting solid retention, water resistance, water developability and molding ability to the resin composition or the cured composition.

Typical examples of the aliphatic conjugated diene monomers (i) are butadiene, isoprene, dimethylbutadiene, chloroprene and a mixture thereof. Typical examples of the alpha, beta-ethylenically unsaturated carboxylic acids (ii) are acrylic acid, methacrylic acid, maleic acid, fumaric acid, tetracosanoic acid, crotonic acid and a mixture thereof. Typical examples of the compounds (iii) having at least two addition polymerizable groups are trimethylolpropane di(meth)acrylate, trimethylolpropane tri(meth)acrylate, divinyl benzene, ethyleneglycol di(meth)acrylate, pentaerythritol tri(meth)acrylate, pentaerythritol tetra(meth)acrylate, 1,4-butanediol di(meth)acrylate, 1,6-hexanediol di(meth)acrylate and a mixture thereof. The term "(meth)acrylate" herein indicates both acrylate and methacrylate. Typical examples of the copolymerizable monomers (iv) other than the monomers (i), (ii) and (iii) are styrene, alpha-methylstyrene, vinyl toluene, acrylonitrile, vinyl chloride, vinylidene chloride, acrylamide, methacrylamide, methyl (meth)acrylate, ethyl (meth)acrylate, n-propyl (meth)acrylate, n-butyl (meth)acrylate, 2-ethylhexyl (meth)acrylate and a mixture thereof.

The partially crosslinked copolymer (A) is prepared by the radical emulsion polymerization of the monomer mixture. The radical emulsion polymerization may be carried out at 15° to 20° C. in an aqueous medium in the presence of a catalyst and an emulsifier. The emulsifier is known to the art, including sodium dodecylbenzenesulfonate and the like. The catalyst is also known to the art, for example sodium persulfate and the like.

The linear polymer (B) contains at least 30 mol %, preferably more than 50 mol % of a conjugated diene unit. The polymer (B) also has number average molecular weight of at least 5,000, preferably 10,000 to 1,000,000. Typical examples of the linear polymers (B) are a liquid isoprene (e.g. LIR 30 or 50 available from Kuraray Co., Ltd.), a maleic acid-modified isoprene (e.g. LIR 403 available from Kuraray Co., Ltd.), a maleic acid halfester-modified isoprene (e.g. LIR 410 available from Kuraray Co., Ltd.), a styrene-isoprene-styrene block copolymer, a styrene-butadiene-styrene block copolymer, a styrene-butadiene rubber and SEBS. The linear polymer (B) is an important component in this invention, especially because the copolymer (A) can not provide enough film toughness by itself due to the characteristics of its partially crosslinked structure.

The basic nitrogen atom-containing compound (C) is preferably a compound which has a vinyl group and a tertiary basic nitrogen atom. The compound (C) is generally represented by

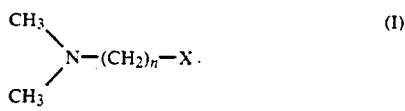

[wherein X shows $-O-CO-CR^1=CH_2$, $-NH-CO-CR^1=CH_2$ or $-O-CO-NH-CO-CR^1=CH_2$ in which $R^1$ respectively shows a hydrogen atom or a methyl group, n is 1, 2 or 3.], or

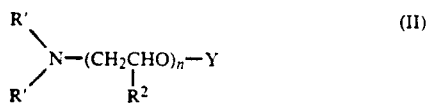

[wherein Y shows a hydrogen atom, $-CO-CR^2=CH_2$, or $-CO-NH-CO-CR^2=CH_2$ in which $R^2$ respectively shows a hydrogen atom or a methyl group, R' shows a methyl group or an ethyl group, provided that when R' shows a methyl group, n shows an integer of 1 to 6 and when R' shows an ethyl group, n shows an integer of 2 to 6.]

The compounds (I) and (II) are preferred for the present invention, provided that the compound (II), when Y shows a hydrogen atom in compound (II), is not so preferred in view of ink resistance. Typical examples of the compounds (I) and (II) are N,N-dimethylaminoethyl (meth)acrylate, N,N-dimethylaminopropyl (meth)acrylate, N,N-dimethylaminoethyl-N'-(meth)acryloylcarbamate, N,N-dimethylaminoethoxyethanol, N,N-diethylaminoethoxyethanol, N,N-diethylaminoethoxyethyl (meth)acrylate and a mixture thereof. In addition to the above mentioned compounds (I) and (II), the compound (C) can be other basic nitrogen atom-containing compound, for example 2-N-morpholinoethanol and 2-piperidinoethanol. The other compound (C) may be combined with the above mentioned compounds (I) and (II).

The monomer (D) has an ethylenically unsaturated group. Typical examples of the monomers (D) are unsaturated carboxylate, such as butyl (meth)acrylate, 2-ethylhexyl (meth)acrylate, lauryl (meth)acrylate, stearyl (meth)acrylate, polyethyleneglycol mono(meth)acrylate, methoxypolyethyleneglycol mono(meth)acrylate, polypropyleneglycol mono(meth)acrylate, phenoxypolyethyleneglycol mono(meth)acrylate, ethyleneglycol di(meth)acrylate, diethyleneglycol di(meth)acrylate, triethyleneglycol di(meth)acrylate, diallyl itaconate, glycerol di(meth)acrylate, glycerol tri(meth)acrylate, 1,3-propyleneglycol di(meth)acrylate, 1,4-cyclohexanediol di(meth)acrylate, 1,2,4-butanetriol tri(meth)acrylate, glycerolpolypropyleneglycol tri(meth)acrylate, 1,4-benzenediol di(meth)acrylate, pentaerythritol tetra(meth)acrylate, tetramethyleneglycol di(meth)acrylate, 1,5-pentanediol di(meth)acrylate and 1,6-hexanediol di(meth)acrylate; unsaturated amides, such as methylene bis(meth)acrylamide, ethylene bis(meth)acrylamide, 1,6-hexamethylene bis(meth)acrylamide, diethylenetriamine tris(meth)acrylamide, N-hydroxymethyl (meth)acrylamide, N-beta-hydroxyethyl (meth)acrylamide and N,N'-bis(betahydroxyethyl) (meth)acrylamide; divinyl esters, such as divinyl adipate and divinyl phthalate; (meth)acrylated urethanes, such as a compound derived from a hydroxyalkyl (meth)acrylate and an isocyanate compound; a product of an aromatic compound and a polyhydric alcohol; such as diepoxypolyether derived from bisphenol or a novolac compound; and a mixture thereof. It is preferred that the monomer (D) is water insoluble.

The monomer (D) preferably includes a polyfunctional monomer, which imparts a high water resistance to the printing plate obtained from the composition but does not inhibit water developability. The polyfunctional monomer more preferably is compatible with the resin system of the present invention and listed in U.S. Pat. No. 3,801,328 which is herein incorporated.

The photopolymerization initiator (E) of the present invention includes benzoin ethers, such as banzoin isopropyl ether and benzoin isobutyl ether; benzophenones, such as benzophenone and methyl-o-benzoyl benzoate; xanethones, such as xanethone, thioxanethone and 2-chlorothioxanethone; acetophenones, such as acetophenone, trichloroacetophenone, 2,2-diethoxyacetophenone and 2,2-dimethoxy-2-phenylacetophenone; benzyl; 2-ethylanthraquinone; methylbenzoyl formate; 2-hydroxy-2-methylpropiophenone; 2-hydroxy-2-methyl-4'-isopropylisopropiophenone; 1-hydroxycyclohexyl phenyl ketone; a mixture thereof; and the like.

In the photosensitive resin composition of the present invention, the copolymer (A) may be present in an amount of 40 to 90% by weight, preferably 45 to 65. Amounts of less than 40% by weight has poor solid retention and amounts of more than 90% by weight cure insufficiently. The linear polymer (B) may be present in an amount of 5 to 30% by weight, preferably 15 to 25% by weight. Amounts of less than 5% by weight has poor mechanical strength and amounts of more than 30% by weight deteriorate water developability. The monomer (D) may be present in an amount of 5 to 60% by weight, preferably 5 to 30. Amounts of less than 5% by weight cure insufficiently and amounts of more than 60% by weight deteriorate solid retention. The initiators (E) may be present in 0.01 to 10% by weight, 0.1 to 5% by weight. Amounts of less than 0.01% by weight lower toughness and amounts of more the 10% by weight deteriorate photosensitivity. The compound (C) may be present in an amount of 0.20 to 2.0 mol, preferably 0.50 to 1.50 mol, based on one mol of the carboxyl groups in the copolymer (A). Amounts of less than 0.20 mol deteriorate water developability and amounts of more than 2.0 mol lower water resistance of the obtained printing plate.

The above mentioned components (A) to (E) are homogeneously melt-mixed by a conventional method (e.g. a extruder or a calender) to form the photosensitive resin composition which is then formed to a suitable shape (e.g. sheet or plate) on a substrate to obtain a photosensitive resin plate. The substrate is one which is usually employed for the photosensitive resin plates, for example a plastic plate, a plastic sheet, a metal plate and a metal foil.

The photosensitive resin composition of the present invention may contain additives, such as a thermal-polymerization inhibitor, an antioxidant, an ozonization inhibitor, an organic or inorganic filler, a reinforcer and a plasticizer. Typical examples of the thermal-polymerization inhibitors are hydroquinone, p-methoxyphenol, mono-t-butylhydroquinone, catechol, p-t-butylcatechol, 2,6-di-t-butyl-p-cresol, benzoquinone, 2,5-diphenyl-p-benzoquinone, t-butylpyrocatechol, pyrogallol, betanaphthol, phenothiazine, pyridine, nitrobenzene, dinitrobenzene, a nitroso dimer inhibitor as described in U.K. Patent 1,453,681, a bis(substituted amino)sulfide as described in U.S. Pat. No. 4,168,981, p-toluquinone, chloranyl, a thiazine dye (e.g. thionine blue G(CI 52025), methylene blue B (CI 52015) and toluidine blue (CI 52040)) and a mixture thereof. Preferred are 2,6-di-t-butyl-p-cresol and p-methoxyphenol. The thermal-polymerization inhibitor may be present in the composition in an amount of 0.001 to 2.0% by weight based on a solid content of the resin composition. Typical examples of the antioxidants are alkylated phenols, such as 2,6-di-t-butyl-p-cresol; alkylated bisphenol, such as 2,2-methylenebis(4-methyl-6-t-butylphenol), 1,3,5-trimethyl-2,4,6-tris-(3,5-di-t-butyl-4-hydroxybenzyl)benzene, 2,4-hydroxy-3,5-di-t-butylanilino-4,6-bis(n-octylthio)-1,3,5-triazine; polymeric trimethyldihydroquinone; dilaurylthio dipropionate; a mixture thereof; and the like. Typical examples of the antiozonants are microcrystalline wax, parafin wax, dibutylthiourea, 1,1,3,3-tetramethyl-2-thiourea, antiozonant AFD (available from Nafton Co., Ltd.), a norbornene (e.g. di-5-norbornene-2-methyl adipate, di-5-norbornene-2-methyl maleate, di-5-norbornene-2-methyl terephthalate, Ozon Protector 80 (available from Reichfold Chemical Co., Ltd.)), N-phenyl-2-naphthylamine, an unsaturated vegetable oil (e.g. rapeseed oil, linseed oil and safflower oil), a polymer or resin (e.g. ethylene-vinyl acetate copolymer, polyethylene chloride, polyethylene chlorosulfate, ethylene chloride/methacrylic acid copolymer, polyurethane, polypentadiene, polybutadiene, furfural derived resin, ethyle/propylene/diene rubber, diethyleneglycol of rosin and alpha-methylstyrene/vinyltoluene copolymer), a mixture thereof and the like. The ozone resistance of the printing plate may also be improved by annealing the plate at an elevated temperature before use. It is required that the organic or inorganic filler is transparent to the light to be exposed and does not scatter it. The filler can be immiscible with the resin composition and be polymeric or non-polymeric, including polystyrene, silica, bentonite, glass powder, colloid carbon, a variety of dye or pigment and a mixture thereof. An amount of the filler can be varied by the desired properties of the resin composition and the like. The filler is added to the composition for an improvement of strength, the reduction of vicosity and a colorant. The plasticizer can be added to the composition to reduce a glass transition temperature of the composition, thus enhancing developability. Typical examples of the plasticizers are those which are miscible with the polymer of the resin composition, such as a dialkyl phthalate, an alkylphosphate, a polyethylene glycol, a polyethylene glycol ester and a polyethylene glycol ether.

The obtained resin plate is generally exposed to chemical light sources through a negative film and polymerized at light-exposed portions to form latent images. Typical examples of the chemical light sources are ultraviolet. The exposed resin plate is developed by rinsing with water to obtain relief images. The obtained plate is then dried and post-exposed to the light sources to obtain a flexographic printing plate which has high water resistance, wear resistance, bending resistance, rubber resilience and mechanical strength. Both the resin plate and the printing plate have high accuracy of film thickness and size retention. The printing plate is suitable for aqueous ink or alcohol-based ink and shows excellent ink density and dot gradation. The printing plate is very suitable for commercial flexographic printing of industrial scale.

EXAMPLES

The present invention is illustrated by the following Examples which, however, are not to be construed as limiting the present invention to their details. In Examples, all "parts" are based on weight unless otherwise indicated.

EXAMPLE 1

A partially crosslinked copolymer was prepared from 84.1 mol % of butadiene, 2.2 mol % of methacrylic acid, 1.2 mol % of ethyleneglycol dimethacrylate and 12.5 mol % of ethyl acrylate. Then, 60.0 parts of the partially crosslinked copolymer was mixed with 5.50 parts (corresponding to 1.55 mol based on one mol of the carboxylic groups of the copolymer) of N,N-dimethylaminopropyl methacrylamide, 13.25 parts of a liquid polyisoprene having a molecular weight of 29,000 (LIR-30 available from Kuraray Co., Ltd.), 5.75 parts of a urethane acrylate oligomer (available from Sartomer Co., Ltd. as CHEMLINK-9505), 11.50 parts of a liquid butadiene oligomer (available from Ube Kosan Co., Ltd. as Hycar VTBNX), 3.40 parts of 2,2-dimethoxy-2-phenylacetophenone and 0.60 parts of 2,6-di-t-butyl-p-cresol, and well mixed by a pressured biaxal kneader. The obtained composition was extruded by a kneader extruder having a T die onto a polyester film which was preliminary coated in a thickness of 5 micron with a chloroprene adhesive (available from Hitachi Chemical Co., Ltd. as HiBon 1920 LT) to obtain a photosensitive resin plate having an about 1.7 mm photosensitive resin layer.

The resin surface of the obtained resin plate was contacted with a negative film having suitable images under vacuum and exposed to a ultraviolet lamp of 350

W for 10 minutes. It was then eluted with water at 40° C. for 45 seconds, using a washout machine (available from Nippon Densi Seiki Co., Ltd. as JW-A2-PD) to obtain a printing plate having a relief (0.76 mm) which was faithful to the negative images. The printing plate was evaluated by impact resilience, hardness (Shore A), mechanical strength and ink smoothness. Water developability of the resin plate was also evaluated by a resin thickness eluted in one minute (mm/min). The results are shown in Table 4.

The obtained printing plate had resilience and good toughness as shown in Table 4. Printing was conducted by a flexographic printing machine at 600 feet/min with an aqueous flexographic ink. After 150,000 sheets of paper were printed, no changes were seen on the surface of the printing plate.

EXAMPLE 2

A printing plate was prepared as generally described in Example 1, with the exception that 13.25 parts of an isoprene polymer (available from Kuraray Co., Ltd. as LIR-50) was employed instead of the liquid isoprene. The same tests were conducted as shown in Example 1 and the results are shown in Table 4.

The printing plate had resilience and good toughness and showed no changes after printing after printing 150,000 sheets.

EXAMPLE 3

A printing plate was prepared as generally described in Example 1, with the exception that 13.25 parts of a liquid maleic anhydride modified isoprene polymer (available from Kuraray Co., Ltd. as LIR-403) was employed instead of the liquid isoprene. The same tests were conducted as shown in Example 1 and the results are shown in Table 4.

The printing plate had resilience and good toughness and showed no changes after printing after printing 150,000 sheets.

EXAMPLE 4

A printing plate was prepared as generally described in Example 1, with the exception that 13.25 parts of a liquid maleic acid halfester modified isoprene polymer (available from Kuraray Co., Ltd. as LIR-410) was employed instead of the liquid isoprene. The same tests were conducted as shown in Example 1 and the results are shown in Table 4.

The printing plate had resilience and good toughness and showed no changes after printing after printing 150,000 sheets.

EXAMPLE 5

A printing plate was prepared as generally described in Example 1, with the exception that 13.25 parts of a copolymer of 85.6 mol % of butadiene, 9.1 mol % of methacrylic acid and 5.3 mol % of ethyl acrylate was employed instead of the liquid isoprene. The same tests were conducted as shown in Example 1 and the results are shown in Table 4.

The printing plate had resilience and good toughness and showed no changes after printing after printing 150,000 sheets.

EXAMPLE 6

A partially crosslinked copolymer was prepared from 84.1 mol % of butadiene, 2.2 mol % of methacrylic acid, 1.2 mol % of ethyleneglycol dimethacrylate and 12.5 mol % of styrene. Then, 55.0 parts (corresponding to 1.64 mol based on one mol of the carboxyl groups of the copolymer) of the partially crosslinked copolymer was mixed with 5.50 parts of N,N-dimethylaminopropyl methacrylamide, 5.0 parts of a styrene-butadiene-styrene block copolymer (Kraton No. 1102 available from Shell Chemical Co., Ltd.), 13.25 parts of a lauryl methacrylate, 5.75 parts of a urethane acrylate oligomer (available from Sartomer Co., Ltd. as CHEMLINK-9504), 11.50 parts of a liquid butadiene oligomer (available from Ube Kosan Co., Ltd. as Hycar VTBNX), 3.40 parts of 2,2-dimethoxy-2-phenylacetophenone and 0.60 parts of 2,6-di-t-butyl-p-cresol, and well mixed at 60° C. by a pressured biaxial kneader. The obtained composition was extruded by a kneader extruder having a T die onto a polyester film which was preliminary coated in a thickness of 5 micron with a chloroprene adhesive (available from Hitachi Chemical Co., Ltd. as HiBon 1920 LT) to obtain a photosensitive resin plate having an about 1.7 mm photosensitive resin layer.

The resin surface of the obtained resin plate was contacted with a negative film having suitable images under vacuum and exposed to a ultraviolet lamp of 350 W for 10 minutes. It was then eluted with water at 40° C. for 55 seconds, using a washout machine (available from Nippon Densi Seiki Co., Ltd. as JW-A2-PD) to obtain a printing plate having a relief (0.76 mm) which was faithful to the negative images. The printing plate was evaluated by impact resilience, hardness (Shore A), mechanical strength and ink smoothness. Water developability of the resin plate was also evaluated by a resin thickness eluted in one minute (mm/min). The results are shown in Table 4.

The obtained printing plate had resilience and good toughness as shown in Table 4. Printing was conducted by a flexographic printing machine at 600 feet/min with an aqueous flexographic ink. After 150,000 sheets of paper were printed, no changes were seen on the surface of the printing plate.

EXAMPLE 7

A printing plate was prepared as generally described in Example 6, with the exception that 5 parts of a styrene-isoprene-styrene block copolymer (Kraton No. 1107 available from Shell Chemical Co., Ltd.) was employed instead of the styrene-butadiene-styrene isoprene (Kraton 1102). The same tests were conducted as shown in Example 6 and the results are shown in Table 4.

The printing plate had resilience and good toughness and showed no changes after printing after printing 150,000 sheets.

COMPARATIVE EXAMPLE 1

A printing plate was prepared as generally described in Example 1, with the exception that 13.25 parts of dibutyl fumarate was employed instead of the liquid isoprene. The same tests were conducted as shown in Example 1 and the results are shown in Table 4.

The printing plate had brittle and showed some defects after printing after printing 150,000 sheets.

COMPARATIVE EXAMPLE 2

A printing plate was prepared as generally described in Example 1, with the exception that 13.25 parts of the partially crosslinked copolymer of Example 1 was employed instead of the liquid isoprene. The same tests were conducted as shown in Example 1 and the results are shown in Table 4.

The printing plate had resilience and good toughness, but it was very hard. The printing plate did not provide good printed paper after printing after printing 150,000 sheets.

EXAMPLES 8 to 11

A printing plate was prepared as generally described in Example 1, with the exception that 13.25 parts of a liquid maleic anhydride halfester modified isoprene polymer (available from Kuraray Co., Ltd. as LIR-410) was employed instead of the liquid isoprene and the weight ratio of the isoprene LIR-410 and the partially crosslinked copolymer of Example 1 was changed as shown in Table 1. The same tests were conducted as shown in Example 1 and the results are shown in Table 4.

TABLE 1

|  | Copolymer (parts) | LIR-410 (parts) |
|---|---|---|
| Ex. 8 | 50.00 | 23.48 |
| Ex. 9 | 50.00 | 18.48 |
| Ex. 10 | 65.00 | 8.48 |
| Ex. 11 | 70.00 | 3.48 | shown in Example 1 and the results are shown in Table 4.

TABLE 2

|  | Kraton 1107 (parts) | Lauryl methacrylate (parts) |
|---|---|---|
| Ex. 12 | 15.00 | 3.38 |
| Ex. 13 | 10.00 | 8.38 |

COMPARATIVE EXAMPLES 3 to 7

A printing plate was prepared as generally described in Example 1, with the exception that a liquid butadiene as shown in Table 3 was employed instead of the liquid isoprene. The same tests were conducted as shown in Example 1 and the results are shown in Table 4.

TABLE 3

| Comparative Ex. No. | Liquid polybutadiene | Molecular weight LIR-410 |
|---|---|---|
| 3 | Hycar CTB | 4,800 |
| 4 | CTBN 1300 × 31 | 3,500 |
| 5 | CTBN 1300 × 8 | 3,500 |
| 6 | CTBN 1300 × 13 | 3,500 |
| 7 | CTBNX 1300 × 9 | 3,500 |

TABLE 4

|  | Water developability (mm/min) | Impact resilience[1] (% 20° C.) | Hardness (Shore A) (20° C.) | Mechanical strength | | Ink smoothness[4] |
|---|---|---|---|---|---|---|
|  |  |  |  | Toughness of film[2] (erg/cm$^2$) | Bending resistance[3] |  |
| Examples |  |  |  |  |  |  |
| 1 | 1.22 | 31.5 | 67.9 | 26.0 × 10$^7$ | 180° OK | Good |
| 2 | 1.21 | 34.0 | 68.0 | 49.9 × 10$^7$ | 180° OK | Good |
| 3 | 0.09 | 36.5 | 68.0 | 59.2 × 10$^7$ | 180° OK | Good |
| 4 | 0.37 | 36.0 | 63.6 | 41.1 × 10$^7$ | 180° OK | Very good |
| 5 | 0.48 | 34.0 | 66.0 | 62.7 × 10$^7$ | 180° OK | Good |
| 6 | 0.84 | 32.5 | 60.0 | 16.8 × 10$^7$ | 180° OK | Very good |
| 7 | 0.68 | 31.0 | 59.3 | 13.4 × 10$^7$ | 180° OK | Very good |
| Comparative Examples |  |  |  |  |  |  |
| 1 | 1.30 | 36.0 | 64.0 | 23.9 × 10$^7$ | 4 mm diameter* | Very good |
| 2 | 1.20 | 36.0 | 80.0 | 30.0 × 10$^7$ | 6 mm diameter | Bad |
| Examples |  |  |  |  |  |  |
| 8 | 0.30 | 35.0 | 57.2 | 16.1 × 10$^7$ | 180° OK | Very good |
| 9 | 0.33 | 37.0 | 61.6 | 46.3 × 10$^7$ | 180° OK | Very good |
| 10 | 0.46 | 37.0 | 66.5 | 59.4 × 10$^7$ | 180° OK | Good |
| 11 | 0.64 | 35.0 | 70.4 | 57.8 × 10$^7$ | 180° OK | Good |
| 12 | 0.29 | 40.0 | 56.0 | 42.0 × 10$^7$ | 180° OK | Very good |
| 13 | 0.43 | 38.0 | 58.2 | 33.6 × 10$^7$ | 180° OK | Very good |
| Comparative Examples |  |  |  |  |  |  |
| 3 | 0.98 | 34.0 | 66.0 | 21.7 × 10$^7$ | 2 mm diameter | Bad |
| 4 | 1.02 | 34.0 | 66.0 | 19.8 × 10$^7$ | 2 mm diameter | Bad |
| 5 | 1.08 | 34.0 | 66.0 | 19.2 × 10$^7$ | 2 mm diameter | Bad |
| 6 | 1.06 | 34.0 | 66.0 | 20.3 × 10$^7$ | 2 mm diameter | Bad |
| 7 | 1.06 | 34.0 | 66.0 | 19.0 × 10$^7$ | 2 mm diameter | Bad |

[1]Impact resilience: Determined by a resilometer available from Shore Company
[2]Toughness of film: This shows a rupture energy determined by a tensile test according to JIS K-6301.
[3]Bending test: The printing plate was bended 180° around a rod and no cracks were observed (180° OK). *shows a diameter of the rod at which cracks were observed.
[4]Ink smoothness: An aqueous ink was employed and printing was conducted. Very good — ink was very smoothly covered on the relief. Good — some thin spots were seen. Bad — many thin spots were seen.

EXAMPLES 12 and 13

A printing plate was prepared as generally described in Example 6, with the exception that 5 parts of a styrene-isorene-styrene block copolymer (Kraton 1107) was employed instead of the styrene-butadiene-styrene block copolymer (Kraton 1102) and the weight ratio of the Creiton 1107 and lauryl methacrylate was changed as shown in Table 2. The same tests were conducted as

What is claimed is

1. A photosensitive resin composition for flexographic printing, comprising;
    (A) a partially crosslinked copolymer prepared by a radical emulsion polymerization of a monomer mixture which comprises;
        (i) 40 to 95 mol % of an aliphatic conjugated diene monomer, (ii) 1 to 30 mol % of an alpha, betaethylenically unsaturated carboxylic acid, and (iii) 0.1 to 10 mol % of a compound having at least two addition polymerizable groups, (B) a linear polymer having a molecular weight of at least 5,000, which has at least 30 mol % of a conjugated diene unit, (C) a basic nitrogen atom-containing compound, (D) a photopolymerizable ethylenically unsaturated monomer, and (E) a photopolymerization initiator.

2. The photosensitive resin composition according to claim 1 wherein said monomer mixture further contains a copolymerizable monomer (iv) other than the monomers (i), (ii) and (iii).

3. The photosensitive resin composition according to claim 1 wherein said linear polymer (B) is polyisoprene, styrene-isoprene-styrene block copolymer, styrene-butadiene-styrene block copolymer or styrene-butadiene rubber.

4. The photosensitive resin composition according to claim 1 wherein said basic nitrogen atom-containing compound (C) is represented by

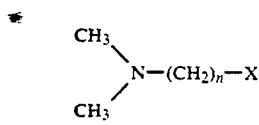

[wherein X shows —O—CO—CR¹=CH₂, —NH—CO—CR¹=CH₂ or —O—CO—NH—CO—CR¹=CH₂ in which R¹ respectively shows a hydrogen atom or a methyl group, n is 1, 2 or 3.], or

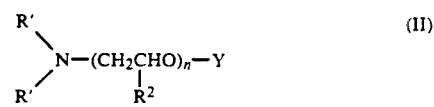

[wherein Y shows a hydrogen atom, —CO—CR²=CH₂, or —CO—NH—CO—CR²=CH₂ in which R² respectively shows a hydrogen atom or a methyl group, R' shows a methyl group or an ethyl group, provided that when R' shows a methyl group, n shows an integer of 1 to 6 and when R' shows an ethyl group, n shows an integer of 2 to 6.].

5. The photosensitive resin composition according to claim 1 wherein said photopolymerizable ethylenically unsaturated monomer is an unsaturated carboxylate or an unsaturated amide.

6. The photosensitive resin composition according to claim 1 wherein said photopolymerization initiator is a benzoin ether, a xanethone, an acetophenone, benzyl or 2-ethylanthraquinone.

7. The photosensitive resin composition according to claim 1 wherein said photosensitive resin composition contains 40 to 90% by weight of the copolymer (A), 5 to 30% by weight of the linear polymer (B), 0.2 to 2.0 mol based on the carboxyl groups in the copolymer (A) of the basic nitrogen atom-containing compound (C), 5 to 60% by weight of the photopolymerizable ethylenically unsaturated monomer (D) and 0.01 to 10% by weight of the polymerization initiator.

8. The photosensitive resin composition according to claim 1 wherein said photosensitive resin composition further contains a thermal-polymerization inhibitor, an antioxidant, an anti-ozonant, an organic or inorganic filler, a reinforcing agent or a plasticizer.

9. A photosensitive resin plate for flexographic printing, comprising a substrate and a photosensitive resin layer formed thereon, wherein said photosensitive resin layer is formed from the photosensitive resin composition according to claim 1.

10. A process for preparing the resin plate according to claim 9 comprising melt-mixing the photosensitive resin composition of claim 1 and forming a photosensitive resin layer on a substrate.

* * * * *